United States Patent
Huang

(10) Patent No.: US 6,723,613 B2
(45) Date of Patent: Apr. 20, 2004

(54) METHOD OF FORMING AN ISOLATED-GRAIN RUGGED POLYSILICON SURFACE VIA A TEMPERATURE RAMPING STEP

(75) Inventor: Chin-Te Huang, Pudong New Area (CN)

(73) Assignee: Semiconductor Manufacturing International (Shanghai) Corporation, Shanghai (CN)

(*) Notice: Subject to any disclaimer, the term of this patent is extended or adjusted under 35 U.S.C. 154(b) by 0 days.

(21) Appl. No.: 10/188,910

(22) Filed: Jul. 2, 2002

(65) Prior Publication Data

US 2004/0005756 A1 Jan. 8, 2004

(51) Int. Cl.[7] .................................................. H01L 21/20
(52) U.S. Cl. ......................................... 438/398; 438/255
(58) Field of Search ................................. 438/398, 255, 438/964, 394

(56) References Cited

U.S. PATENT DOCUMENTS

| | | | | |
|---|---|---|---|---|
| 5,629,223 A | * | 5/1997 | Takur | 438/398 |
| 6,143,620 A | * | 11/2000 | Sharan et al. | 438/398 |
| 6,337,243 B2 | * | 1/2002 | Ping et al. | 438/255 |
| 6,444,590 B2 | * | 9/2002 | Ping et al. | 438/745 |
| 6,509,227 B1 | * | 1/2003 | Ping et al. | 438/255 |
| 6,521,507 B1 | * | 2/2003 | Thakur et al. | 438/398 |

* cited by examiner

Primary Examiner—Caridad Everhart
(74) Attorney, Agent, or Firm—Townsend and Townsend and Crew LLP

(57) ABSTRACT

A method is disclosed for increasing the surface area of hemispherical-grain polysilicon and for forming a storage-node capacitor plate that can be used in the manufacture of dynamic random access memories (DRAMs). A layer of polycrystalline silicon is deposited on a substrate. This layer is either in-situ doped or doped after it is deposited via implantation or diffusion. Next, an amorphous silicon layer is deposited on top of the polycrystalline silicon layer. Hemispherical-grain (HSG) polysilicon seeds are then grown on the upper surface of the amorphous silicon layer using one of several known techniques. An anneal sequence is then performed in the presence of silane. An initial temperature of about 550° C. is maintained for about 3.5 minutes. At the end of that period, the temperature is ramped at a rate of 2° C. per minutes over a period of about 8 minutes. Upon reaching a temperature of about 568° C., that final temperature is maintained for an additional period of about 6 minutes. During the anneal sequence, silicon atoms within the amorphous silicon layer migrate to the seeded locations and incorporate themselves in the crystal matrices of the HSG seeds, thereby causing them to grow. The ramped temperature during the anneal sequence is highly effective in forming isolated grains of HSG polysilicon. The underlying doped polysilicon layer provides electrical continuity between the isolated grains of HSG polysilicon.

20 Claims, 2 Drawing Sheets

METHOD OF FORMING AN ISOLATED-GRAIN RUGGED POLYSILICON SURFACE VIA A TEMPERATURE RAMPING STEP

BACKGROUND OF THE INVENTION

1. Field of the Invention

This invention relates generally to semiconductor manufacturing technology and, more particularly, to methods for improving the morphology of rugged polycrystalline silicon, as it relates to increased surface area of the material and its usefulness as a capacitor plate electrode in integrated circuits.

2. Description of the Prior Art

In 1965, Gordon Moore, the co-founder of Intel Corporation, observed that the number of transistors per square inch on integrated circuits had doubled every year since the invention of the integrated circuit. Moore predicted that this trend would continue for the foreseeable future. Although the pace slowed somewhat in subsequent years, the past forty years have seen a doubling of transistor density approximately every 18 months. Most experts, including Moore himself, expect this trend to continue for at least another 15 years, when the finite size of atomic particles may limit any significant increases in miniaturization.

The miniaturization trend predicted by Moore has proved applicable to nearly all types of integrated circuits, including logic circuits, microprocessors, and semiconductor memory. As the density of integrated circuits has increased, corresponding increases in device speed have been coupled with corresponding decreases in cost and power consumption per transistor.

For at least a quarter of a century, dynamic random access memory (DRAM)-despite the fact that it is generally slower than static random access memory (SRAM) of the same generation, and requires periodic refresh to prevent data volatility—has established itself as the principal type of main memory for computer applications, as a result of its low cost per bit of storage. The basic units of a DRAM memory cell are a capacitor and an access transistor, through which the capacitor can be initially charged, refreshed, and "read". The cell capacitor generally comprises a storage node plate that is directly coupled to the cell access transistor; a cell plate that is generally maintained at ground potential, and is common to all cells on the same chip; and a dielectric layer sandwiched between the storage node plate and the cell plate. As DRAM density increases, chip real estate available for capacitor construction must invariably decrease. However, the charge required to provide adequate functionality of memory cells and the sense amplifiers used to read their charge contents does not decrease at the same rate. Consequently, DRAM manufacturers have found it necessary to maintain cell capacitance using a variety of three-dimensional techniques, such as the construction of stacked or trench capacitors, the use of new capacitor dielectric materials having higher dielectric constants, and the use of capacitor plate material having non-smooth surfaces.

Silicon has been used extensively, both as a substrate and as a deposited material, for most past and present generations of integrated circuits. Solid silicon exists in both crystalline and amorphous forms. Crystalline silicon can be either monocrystalline or polycrystalline. The wafers, on which most integrated circuits are constructed, are typically monocrystalline (single-crystal) silicon. Under proper conditions, additional monocrystalline silicon can be epitaxially grown on a silicon wafer substrate using chemical vapor deposition. Polycrystalline silicon (often called polysilicon for short), typically results when silicon is deposited at a temperature in excess of about 580° C. using a chemical vapor deposition process in the absence of a monocrystalline surface which could order the deposition of silicon atoms into a single-crystal matrix. At a temperature of less than about 580° C., amorphous silicon will be deposited. The exact transition temperature, where the change from amorphous to polycrystalline silicon occurs, depends on the types of precursor compounds and certain temperature-unrelated reaction conditions used in the chemical vapor deposition process.

Polysilicon is commonly utilized as a material for both capacitor plates in DRAM memory cells, because of its compatibility with subsequent high temperature processing, thermal expansion properties compatible with those of silicon dioxide, and its ability to be conformally deposited over widely varying topography. In order for polysilicon to conduct electricity, it must be conductively doped, which can be accomplished either during the deposition process (in situ) or subsequent to its deposition via diffusion or implantation of the appropriate impurities.

It has been recognized, for about a decade, that capacitance of a capacitor formed from a polysilicon layer can be increased merely by increasing the surface roughness of the polysilicon film that is used as a capacitor storage node. As capacitance is roughly proportional to the surface area of the smallest of the two capacitor plates, capacitance can be increased if roughness of the plate contributes to its area. In order for this to occur, the dielectric layer between a DRAM cell's storage node plate and the cell plate must be sufficiently thin to conformally coat the rough surface of the storage node. In addition, the dielectric layer must be particularly resistant to electrical breakdown, as the rough surface will suffer electrical breakdown at a much lower voltage than would a smooth surface with a dielectric layer of the same composition and thickness. By employing a relatively thin dielectric layer, the roughness on the storage node capacitor plate is transferred to the cell's dielectric layer and, finally, to the cell plate, resulting in a larger surface area and, hence, greater capacitance than would have a similarly shaped capacitor formed from smooth polysilicon capacitive layers.

It is well known in the art that rough polysilicon, known either as rugged polysilicon or hemisherical-grain (HSG) polysilicon, can be formed by a variety of methods. The known methods include a single-step low pressure chemical vapor deposition (LPCVD), and a multi-step procedure involving depositing a layer of amorphous silicon, seeding the layer of amorphous, and annealing the seeded layer to convert the amorphous silicon to HSG. For the single-step method, silicon is deposited at a temperature between the range of temperatures where amorphous silicon is formed and the range of temperatures where polycrystalline silicon is formed. The process is typically performed within a range of about 555–568° C. at a pressure of about 190 mtorr. Silane ($SiH_4$) is typically used as the primary precursor for this process. For the method involving the seeding and annealing of amorphous silicon, an amorphous silicon layer is first deposited. Subsequently, the deposited layer is seeded with either silane or disilane molecules in order to form crystals upon the surface of the amorphous silicon layer. The seeded layer is then annealed in a vacuum. Amorphous silicon atoms migrate and grow grains of HSG on the silicon crystals. The anneal step can be performed at a temperature in excess of about 450° C.

A tracing and subsequent digitization of a scanning electro micrograph of the surface of a 1.34 µm square sample of a rugged polysilicon layer 100 formed using the conventional techniques heretofore described is shown in FIG. 1. It will be noted that an alternating array of plateaus 101 and valleys 102 have been formed within the rugged polysilicon layer 100, thereby increasing the surface area thereof. It will be noted that, with few exceptions, each plateau 101 appears to be interconnected with all other plateaus.

SUMMARY OF THE INVENTION

The present invention includes a method for increasing the surface area of hemispherical-grain polysilicon and for forming a storage-node capacitor plate that can be used in the manufacture of dynamic random access memories (DRAMs). The invention represents an improvement to the multi-step process described in the Background of the Invention section. As the instant process is likely to be used primarily in the manufacture of dynamic random access memories, it will be disclosed in that context. A layer of polycrystalline silicon having a thickness within a range of about 200 to 300 Å is deposited on a substrate. This layer is either in-situ doped or doped after it is deposited via implantation or diffusion. Next, an amorphous silicon layer also having a -thickness within a range of about 200 to 300 Å is deposited on top of the polycrystalline silicon layer. Hemispherical-grain (HSG) polysilicon seeds are then grown on the upper surface of the amorphous silicon layer using one of several known techniques. For example, following a dilute hydrofluoric (DHF) acid dip to remove any native oxide, the amorphous silicon is subjected to an ultra-high vacuum (UHV) condition at a temperature within a range of about 500 to 800° C. for a period of from about 1 to 10 minutes in the presence of either silane or disilane at a concentration below about $1.0 \times 10^{-1}/m^3$. These conditions are conducive to the growth of HSG silicon seeds on the surface of the amorphous silicon layer. An anneal sequence is then performed in the presence of silane. An initial temperature of about 550° C. is maintained for about 3.5 minutes. At the end of that period, the temperature is ramped at a rate of 2° C. per minutes over a period of about 8 minutes. Upon reaching a temperature of about 568° C., that final temperature is maintained for an additional period of about 6 minutes. During the anneal sequence, silicon atoms within the amorphous silicon layer migrate to the seeded locations and incorporate themselves in the crystal matrices of the HSG seeds, thereby causing them to grow. The ramped temperature during the anneal sequence is highly effective in forming isolated grains of HSG polysilicon. The underlying doped polysilicon layer provides electrical continuity between the isolated grains of HSG polysilicon.

PREFERRED EMBODIMENT OF THE INVENTION

The present invention includes a method for increasing the surface area of hemispherical-grain polysilicon and for forming a storage-node capacitor plate that can be used in the manufacture of dynamic random access memories (DRAMs). The invention provides a marked increase in capacitance for capacitor plates so formed by creating isolated clumps or nodules of hemispherical-grain silicon. As the instant process is likely to be used primarily in the manufacture of dynamic random access memories, it will be disclosed in that context.

Figure 2:
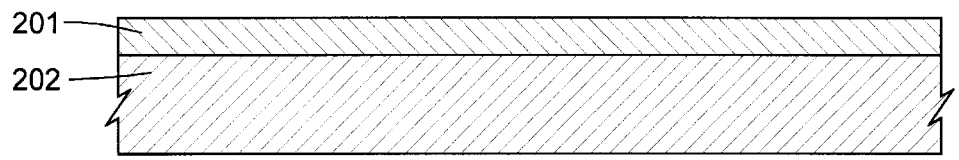
FIG. 2 is a cross-sectional view of a portion of an in-process integrated circuit, which includes a substrate on which has been deposited a polysilicon layer.

Referring now to the in-process integrated circuit 200 of FIG. 2, a polycrystalline silicon (polysilicon) layer 201 having a thickness within a range of about 200 to 300 Å has been deposited superjacent a semiconductor substrate. Preferably, the polysilicon layer 201 is deposited via chemical vapor due to the high degree of conformality (evenness) of thickness) on surfaces of varied orientation and complexity. The polysilicon layer 201 is either in-situ doped or doped after it is deposited via implantation or diffusion so as to render it electrically conductive. For DRAM capacitor plates, phosphorus is considered to be the preferred primary dopant.

Figure 3:
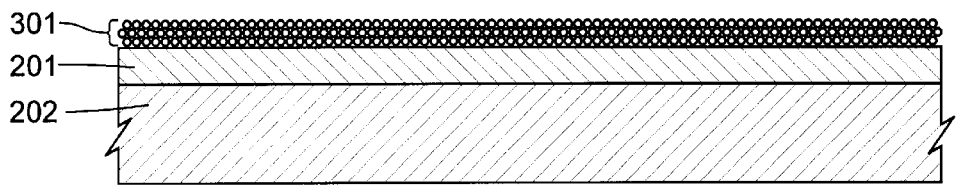
FIG. 3 is a cross-sectional view of the in-process integrated circuit portion of FIG. 2, following the deposition of an amorphous silicon layer thereon.

Referring now to FIG. 3, an amorphous silicon layer 301 having a thickness within a range of about 200 to 300 Å has been deposited superjacent the polysilicon layer 201. The amorphous silicon layer 301 is deposited via chemical vapor deposition at a temperature within a range of 535 to 550° C., using silane gas as a precursor compound.

Figure 4:
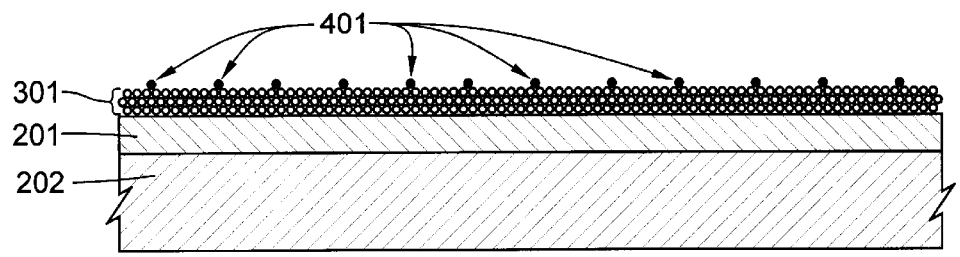
FIG. 4 is a cross-sectional view of the in-process integrated circuit portion of FIG. 3 following seeding of the amorphous silicon layer.

Referring now to FIG. 4, the amorphous silicon layer 301 is seeded with hemispherical-grain (HSG) polysilicon seeds are then grown on the upper surface of the amorphous silicon layer using one of several known techniques. One commonly practiced seeding technique involves subjecting the amorphous silicon layer 301 to a dilute hydrofluoric (DHF) acid dip to remove any native oxide, then subsequently subjecting it to an ultra-high vacuum (UHV) condition at a temperature within a range of about 500 to 800° C. for a period of from about 1 to 10 minutes in the presence of either silane or disilane at a concentration below about $1.0 \times 10^{-3}/m^3$. These conditions are conducive to the growth of HSG silicon seeds, or granules 402, on the surface of the amorphous silicon layer. The seeded amorphous silicon layer 401 is now ready for a novel elevated temperature anneal step.

Figure 5:
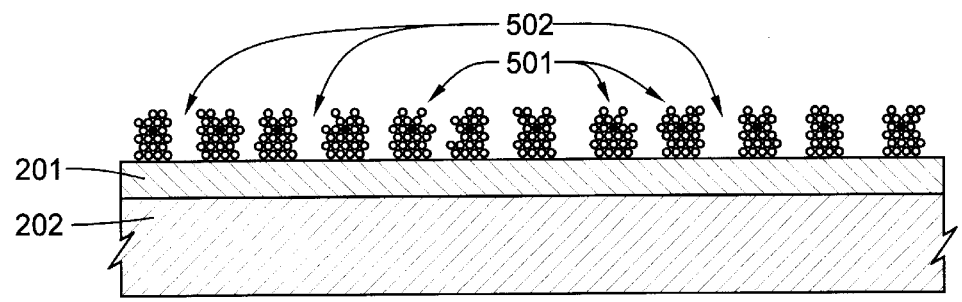
FIG. 5 is a cross-sectional view of the in-process integrated circuit portion of FIG. 4 following a ramped elevated temperature anneal step; an FIG. 6 is a top planar view of a 1.34 µm square sample of a hemispherical-grain polysilicon layer that has been formed using a ramped elevated temperature anneal step.

Referring now to FIG. 5, the seeded amorphous silicon layer 401 is subjected to a ramped anneal procedure. The procedure is implemented by subjected the seeded amorphous silicon layer 401 to an initial temperature of about 550° C. for about 3.5 minutes. The temperature is then ramped to a final temperature of about 565 to 575° C. over a period of about 8 minutes. The final temperature is then maintained for about 6 minutes. For a presently preferred implementation of the anneal procedure, a temperature ramp rate of about 2° C. per minute is employed in combination with a final temperature of about 568° C. During the anneal sequence, silicon atoms within the amorphous silicon layer migrate to the seeded locations and incorporate themselves in the crystal matrices of the HSG seeds, thereby causing them to grow. The ramped temperature during the anneal sequence is highly effective in forming isolated grains, or nodules 501 of HSG polysilicon. Each of the grains 501 is separated from adjacent grains 501 by a valley 502. Thus, the underlying doped polysilicon layer 201 provides electrical continuity between the isolated grains, or nodules 501 of HSG polysilicon.

Tests performed using the isolated-grain rugged poly process for 256-megabyte DRAM devices yielded a cell capacitance increase of 2 femtofarads, or about 8 percent, as compared with DRAM devices manufactured using the conventional rugged polysilicon formula described in the Background of the Invention section.

Figure 1:
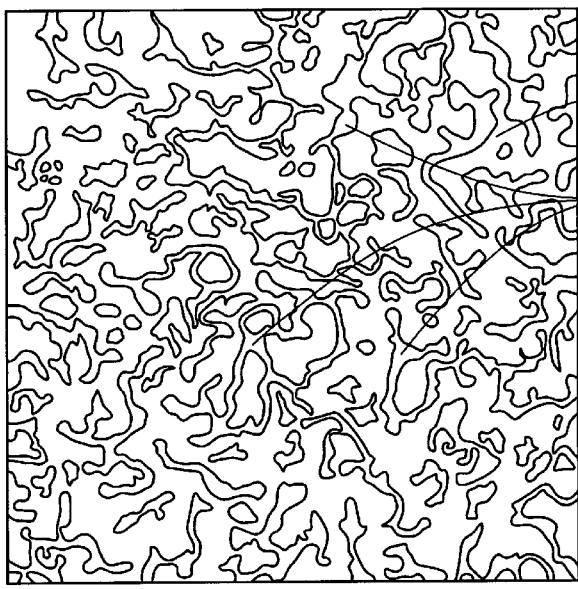
FIG. 1 is a top planar view of a 1.34 µm square sample of a typical hemispherical-grain polysilicon layer that has been formed using conventional techniques known in the art.
Figure 6:
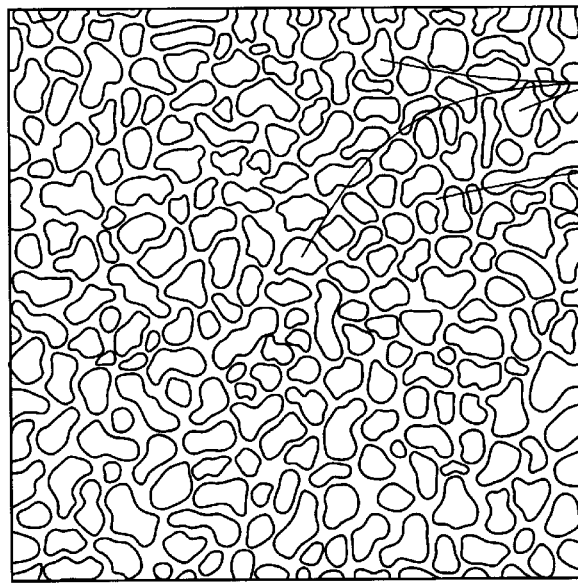

A tracing and subsequent digitization of a scanning electro micrograph of the surface of a 1.34 μm square sample of a rugged polysilicon layer 600, formed using the techniques of the present invention, is shown in FIG. 6. It will be noted that in this drawing figure, each nodule of hemispherical-grain polysilicon 501 is separated from each of the other nodules by a network of interconnecting valleys 502.

Although only a single embodiment of the improved rugged poly formation process is disclosed herein, it will be obvious to those having ordinary skill in the art that changes and modifications may be made thereto without departing from the scope and the spirit of the invention as hereinafter claimed.

What is claimed is:

1. A method of forming a capacitor plate having an isolated-grain rough polysilcon surface, the method comprising the steps of:
    providing a semiconductor substrate;
    depositing a layer of polycrystalline silicon which at least partially overlies the substrate;
    doping the polycrystalline layer to render it electrically conductive;
    depositing an amorphous silicon layer which overlies the polycrystalline layer;
    seeding the amorphous silicon layer with hemispherical-grain polysilicon granules;
    annealing the seeded amorphous silicon layer, which includes temperature ramping from an initial temperature of about 550° C. for to a final temperature within a range of about 565 to 575° C. over a period of about 8 minutes.

2. The method of claim 1, wherein a temperature ramping rate of about 2° C. per minute is employed.

3. The method of claim 1, wherein the initial temperature is maintained for about 3.5 minutes.

4. The method of claim 1, wherein the final temperature is maintained for about 6 minutes.

5. The method of claim 1, wherein the amorphous silicon layer is deposited in a reaction chamber via low-pressure chemical vapor deposition at a temperature within a range of about 535 to 550° C. using silane gas as a precursor compound.

6. The method of claim 1, wherein annealing of the seeded amorphous silicon layer is performed in an ambiance containing silane gas.

7. The method of claim 1, wherein said polycrystalline layer is doped primarily with phosphorus.

8. The method of claim 5, wherein the flow of silane into the reaction chamber is maintained within a range of about 500 to 1200 sccm.

9. The method of claim 6, wherein the annealing step is performed in a furnace into which a silane gas flow, within a range of about 500 to 1200 sccm, is maintained.

10. The method of claim 6, wherein seeding of the amorphous silicon layer is accomplished by:
    subjecting the amorphous silicon layer to a dilute hydrofluoric (DHF) acid dip to remove any native oxide; and
    subjecting the amorphous silicon layer to an ultra-high vacuum condition at a temperature within a range of about 500 to 800° C. for a period of from about 1 to 10 minutes in the presence of either silane or disilane gas at a concentration below about $1.0 \times 10^{-3}/m^3$.

11. A method of converting an amorphous silicon layer to a plurality of spaced-apart hemispherical-grain polysilicon nodules, the method comprising the steps of:
    depositing an amorphous silicon layer which overlies a base layer;
    seeding the amorphous silicon layer with hemispherical-grain polysilicon granules;
    annealing the seeded amorphous silicon layer, which includes temperature ramping from an initial temperature of about 550° C. for to a final temperature within a range of about 565 to 575° C. over a period of about 8 minutes.

12. The method of claim 11, wherein said base layer is a phosphorus-doped polycrystalline silicon layer.

13. The method of claim 11, wherein the intial temperature is maintained for about 3.5 minutes.

14. The method of claim 11, wherein the final temperature is maintained for about 6 minutes.

15. The method of claim 11, wherein the amorphous silicon layer is deposited superjacent a polycrystalline silicon layer in a reaction chamber via low-pressure chemical vapor deposition at a temperature within a range of about 535 to 550° C. using silane gas as a precursor compound.

16. The method of claim 11, wherein annealing of the seeded amorphous silicon layer is performed in an ambiance containing silane gas.

17. The method of claim 15, wherein the flow of silane into the reaction chamber is maintained within a range of about 500 to 1200 sccm.

18. The method of claim 11, wherein the annealing step is performed in a furnace into which a silane gas flow, within a range of about 500 to 1200 sccm, is maintained.

19. The method of claim 11, wherein hemispherical-grain (HSG) polysilicon seeds are grown on the upper surface of the amorphous silicon layer using the steps of:
    subjecting the amorphous silicon layer to a dilute hydrofluoric (DHF) acid dip to remove any native oxide; and
    subjecting the amorphous silicon layer to an ultra-high vacuum condition at a temperature within a range of about 500 to 800° C. for a period of from about 1 to 10 minutes in the presence of either silane or disilane at a concentration below about $1.0 \times 10^{-3}/m^3$.

20. The method of claim 11, wherein a temperature ramping rate of about 2° C. per minute is employed.

* * * * *